(12) United States Patent
Huang et al.

(10) Patent No.: US 6,351,016 B1
(45) Date of Patent: Feb. 26, 2002

(54) TECHNOLOGY FOR HIGH PERFORMANCE BURIED CONTACT AND TUNGSTEN POLYCIDE GATE INTEGRATION

(75) Inventors: Kuo-Ching Huang, Kaohsiung; Shou-Gwo Wuu, Hsin chu County; Jenn-Ming Huang, Hsin-Chu; Dun-Nian Yaung, Taipei, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/389,630

(22) Filed: Sep. 3, 1999

Related U.S. Application Data

(62) Division of application No. 09/035,139, filed on Mar. 5, 1998, now Pat. No. 5,998,269.

(51) Int. Cl.$^7$ ................................................. H01L 29/76
(52) U.S. Cl. ........................ 257/382; 257/388; 257/412
(58) Field of Search ................................. 257/368, 382, 257/383, 388, 412

(56) References Cited

U.S. PATENT DOCUMENTS

| | | | |
|---|---|---|---|
| 5,162,259 A | 11/1992 | Kolar et al. | 437/192 |
| 5,494,848 A | 2/1996 | Chin | 437/191 |
| 5,525,552 A | 6/1996 | Huang | 437/41 |
| 5,543,362 A | 8/1996 | Wu | 437/200 |
| 5,607,881 A | 3/1997 | Huang | 437/195 |
| 5,652,152 A | 7/1997 | Pan et al. | 437/26 |
| 5,654,231 A | 8/1997 | Liang et al. | 438/197 |
| 5,668,051 A | 9/1997 | Chen et al. | 438/558 |
| 5,780,331 A | * 7/1998 | Liaw et al. | 438/238 |
| 5,926,706 A | * 7/1999 | Liaw et al. | 438/238 |
| 5,942,785 A | * 8/1999 | Chen et al. | 257/382 |
| 6,080,647 A | * 6/2000 | Huang et al. | 438/586 |

FOREIGN PATENT DOCUMENTS

EP    0 767 491 A2 *    4/1997

OTHER PUBLICATIONS

Wolf, S., Silicon Processing for the VLSI Era, vol. 2, Lattice Press, 1990, pp. 189–194.*

* cited by examiner

Primary Examiner—T. N. Quach
(74) Attorney, Agent, or Firm—George O. Saile; Stephen B. Ackerman; Rosemary L. S. Pike

(57) ABSTRACT

A buried contact junction is described. A gate silicon oxide layer is provided over the surface of a semiconductor substrate. A polysilicon layer is deposited overlying the gate oxide layer. A hard mask layer is deposited overlying the polysilicon layer. The hard mask and polysilicon layers are etched away where they are not covered by a mask to form a polysilicon gate electrode and interconnection lines wherein gaps are left between the gate electrode and interconnection lines. A layer of dielectric material is deposited over the semiconductor substrate to fill the gaps. The hard mask layer is removed. The polysilicon layer is etched away where it is not covered by a buried contact mask to form an opening to the semiconductor substrate. Ions are implanted to form the buried contact. A refractory metal layer is deposited overlying the buried contact and the polysilicon gate electrode and interconnection lines and planarized to form polycide gate electrodes and interconnection lines. The dielectric material layer is removed. An oxide layer is deposited and anisotropically etched to leave spacers on the sidewalls of the polycide gate electrodes and interconnection lines to complete the formation of a buried contact junction in the fabrication of an integrated circuit.

10 Claims, 8 Drawing Sheets

TECHNOLOGY FOR HIGH PERFORMANCE BURIED CONTACT AND TUNGSTEN POLYCIDE GATE INTEGRATION

RELATED PATENT APPLICATION

This is a division of patent application Ser. No. 09/035,139, filing date Mar. 5, 1998, U.S. Pat. No. 5,998,269, A Technology For High Performance Buried Contact And Tungsten Polycide Gate Integration, assigned to the same assignee as the present invention.

U.S. patent application Ser. No. 09/034,927 to K. C. Huang et al, now U.S. Pat. No. 6,080,647 issued on Jun. 27, 2000.

BACKGROUND OF THE INVENTION (1) Field of the Invention

The invention relates to the fabrication of integrated circuit devices, and more particularly, to a method of forming simultaneously a tungsten polycide gate and an improved buried contact without a trench in the fabrication of integrated circuits.

(2) Description of the Prior Art

FIGS. 1–4 illustrate a typical buried contact process of the prior art. FIG. 1 illustrates a partially completed integrated circuit device. Isolation regions, such as shallow trench isolation (STI) 12, are formed in and on the semiconductor substrate 10. A gate oxide layer 14 is grown upon the surface of the substrate. Typically, a so-called "split poly" process is used wherein a first layer of polysilicon 16 is deposited over the gate oxide layer to protect the gate oxide from the photoresist process. A layer of photoresist is coated over the polysilicon layer 16 and patterned to form the photoresist mask 20.

The polysilicon and gate oxide layers are etched away where they are not covered by the photoresist mask to form an opening where the buried contact is to be formed. As illustrated in FIG. 2, ions 22 are implanted into the semiconductor substrate through the opening to form the buried contact junction 24.

Referring now to FIG. 3, the second layer of the split poly 26 is deposited over the first polysilicon layer and within the opening. A tungsten silicide layer 28 is deposited over the second polysilicon layer. A second photoresist mask 30 is formed over the substrate.

Referring now to FIG. 4, the tungsten silicide layer, two polysilicon layers, and gate oxide layer 28, 26, 16, and 14 are etched to form gate electrode 32 and polysilicon interconnection line 34. Source/drain regions 36 are formed.

As device dimensions and cell size continue to decrease for high density and improved performance in integrated circuits, there is a growing demand for lower junction leakage and lower contact resistance. However, the contact resistance and junction leakage will increase in the conventional buried contact process if there is misalignment of the photoresist mask during polysilicon etching.

FIG. 5 illustrates the case in which the photoresist mask 30 is shifted to the left. Buried contact trench 35 is formed. This causes an increase in both contact resistance and leakage current. FIG. 6 illustrates the case in which the photoresist mask is shifted to the right. A disconnection gap 37 is left between the buried contact 24 and the source/drain region 36. This increases contact resistance by causing a high series resistance.

A number of patents disclose methods for improving a device in which a buried contact trench has been formed. For example, U.S. Pat. No. 5,525,552 to J. M. Huang teaches the use of a low dielectric constant spacer to provide better immunity of the buried contact trench. U.S. Pat. No. 5,607,881 also to J. M. Huang teaches linking the buried contact junction and the source junction by an extra high dosage N+ implant to overcome the disadvantages of a buried contact trench. U.S. Pat. No. 5,668,051 to Chen et al teaches a thin polysilicon layer within the buried contact trench. U.S. Pat. No. 5,652,152 to Pan et al discloses the use of a PSG spacer to solve the buried contact trench problem.

Other patents teach methods to avoid forming a buried contact trench. For example, U.S. Pat. No. 5,494,848 to H. W. Chin teaches the use of a reverse tone oversized buried contact mask to prevent formation of a buried contact trench. U.S. Pat. No. 5,654,231 to M. S. Liang et al teaches the use of sidewall spacers to prevent the formation of a buried contact trench in DRAM technology. Co-pending U.S. patent application Ser. No. 09/034,927 to K. C. Huang et al, now U.S. Pat. No. 6,080,647 issued on Jun. 27, 2000, teaches forming a buried contact after formation of the gate electrode and interconnection lines and selective deposition of tungsten over the buried contact and gate electrode.

Still other patents teach other buried contact processes. For example, U.S. Pat. No. 5,543,362 to Wu teaches a process in which a silicide layer is deposited over the buried contact region followed by a polysilicon layer and topped with a second silicide layer. U.S. Pat. No. 5,162,259 to Kolar et al teaches forming a silicide over the buried contact region and depositing polysilicon overlying the silicide.

SUMMARY OF THE INVENTION

A principal object of the present invention is to provide an effective and very manufacturable method of forming buried contact junctions.

Another object of the present invention is to provide a method of forming buried contact junctions which avoids the formation of a trench caused by mask misalignment.

Another object of the invention is to provide a method of forming buried contact junctions which avoids the formation of a disconnection gap caused by mask misalignment.

Yet another object of the present invention is to provide a method of forming buried contact junctions in which only a single deposition of polysilicon is required.

A further object of the invention is to provide a method of forming buried contact junctions in which the buried contact is connected and the polycide gate and interconnection lines are formed simultaneously.

A still further object is to provide a method of forming buried contact junctions which avoids the formation of a trench caused by mask misalignment and in which only a single deposition of polysilicon is required.

A still further object is to provide a method of forming buried contact junctions which avoids the formation of a trench caused by mask misalignment, in which only a single deposition of polysilicon is required, and in which the buried contact is connected and the polycide gate and interconnection lines are formed simultaneously.

In accordance with the objects of this invention a new method of forming an improved buried contact junction is achieved. A gate silicon oxide layer is provided over the surface of a semiconductor substrate. A polysilicon layer is deposited overlying the gate oxide layer. A hard mask layer is deposited overlying the polysilicon layer. The hard mask and polysilicon layers are etched away where they are not covered by a mask to form a polysilicon gate electrode and interconnection lines having a hard mask layer thereover wherein gaps are left between the gate electrode and interconnection lines. A layer of dielectric material is deposited over the semiconductor substrate to fill the gaps. The hard mask layer is removed. Thereafter, the polysilicon layer is etched away where it is not covered by a buried contact mask to form an opening to the semiconductor substrate. Ions are implanted to form the buried contact. A refractory metal layer, such as tungsten or tungsten silicide, is deposited over lying the buried contact and the polysilicon gate electrode and interconnection lines and planarized to form polycide gate electrodes and interconnection lines. The dielectric material layer is removed. An oxide layer is deposited and anisotropically etched to leave spacers on the sidewalls of the polycide gate electrodes and interconnection lines to complete the formation of a buried contact junction in the fabrication of an integrated circuit.

Also, in accordance with the objects of this invention, a new integrated circuit device having a buried contact junction is described. A buried contact junction lies within a semiconductor substrate having a tungsten or tungsten silicide contact layer thereover. A polycide gate electrode lies on the surface of the semiconductor substrate having source and drain regions within the semiconductor substrate surrounding the polycide gate electrode wherein one of the source and drain regions contacts the buried contact junction. An insulating layer overlies the said polycide gate electrode, the tungsten contact layer, and the source and drain regions. A patterned conducting layer overlies the insulating layer and extends through an opening in the insulating layer to another one of the underlying source and drain regions.

BRIEF DESCRIPTION OF THE DRAWINGS

In the accompanying drawings forming a material part of this description, there is shown.

DESCRIPTION OF THE PREFERRED EMBODIMENTS

Figure 1:
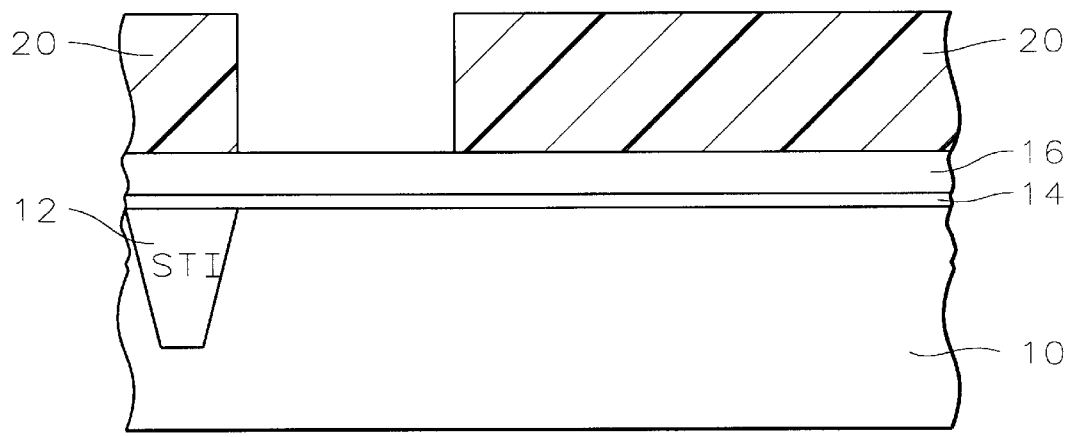
FIGS. 1 through 6 schematically illustrate in cross-sectional representation a buried contact process of the prior art.
Figure 2:
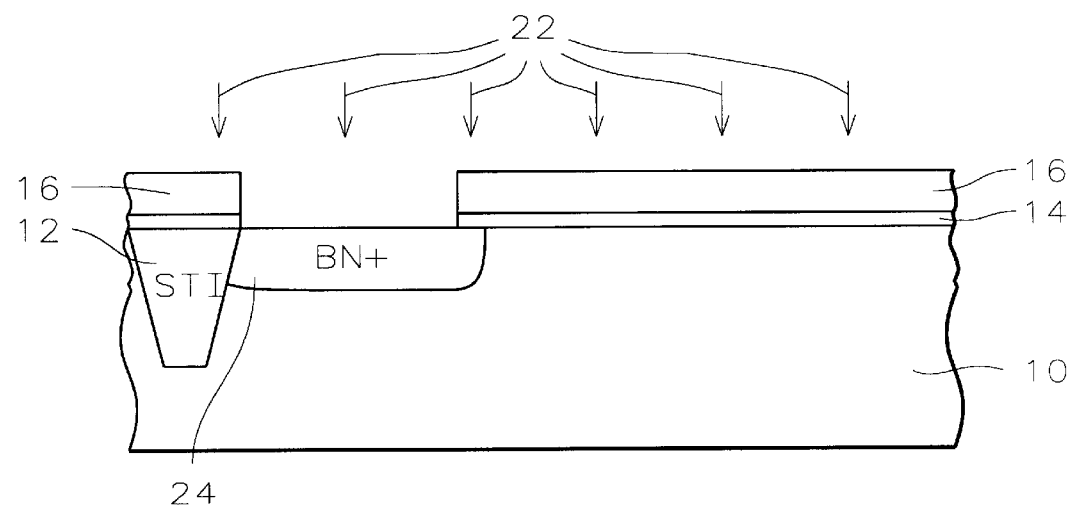
Figure 3:
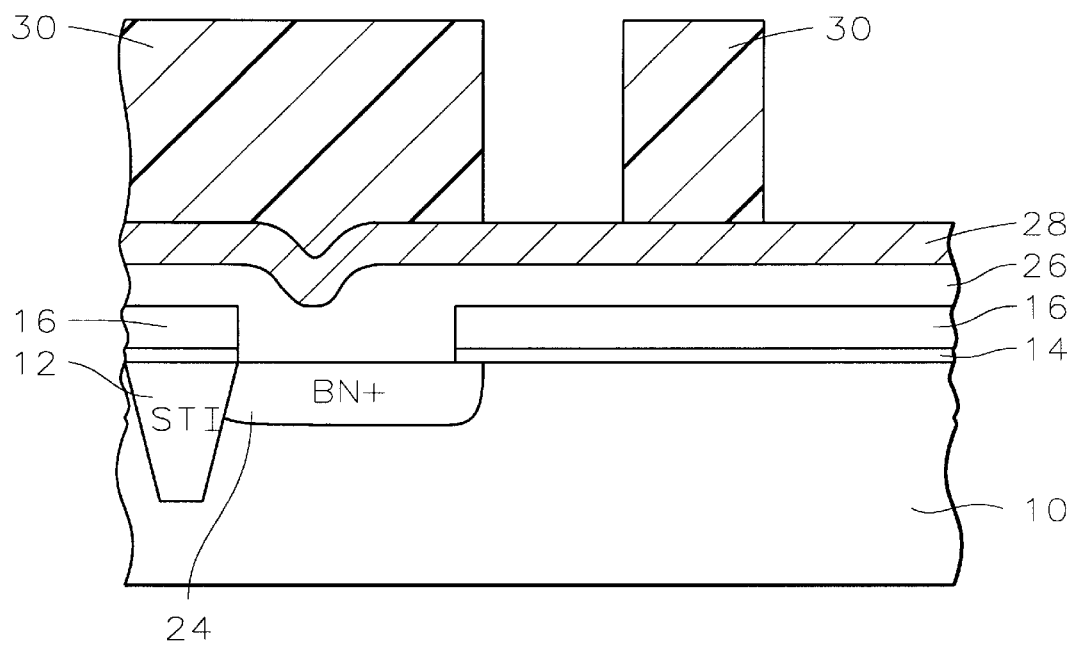
Figure 4:
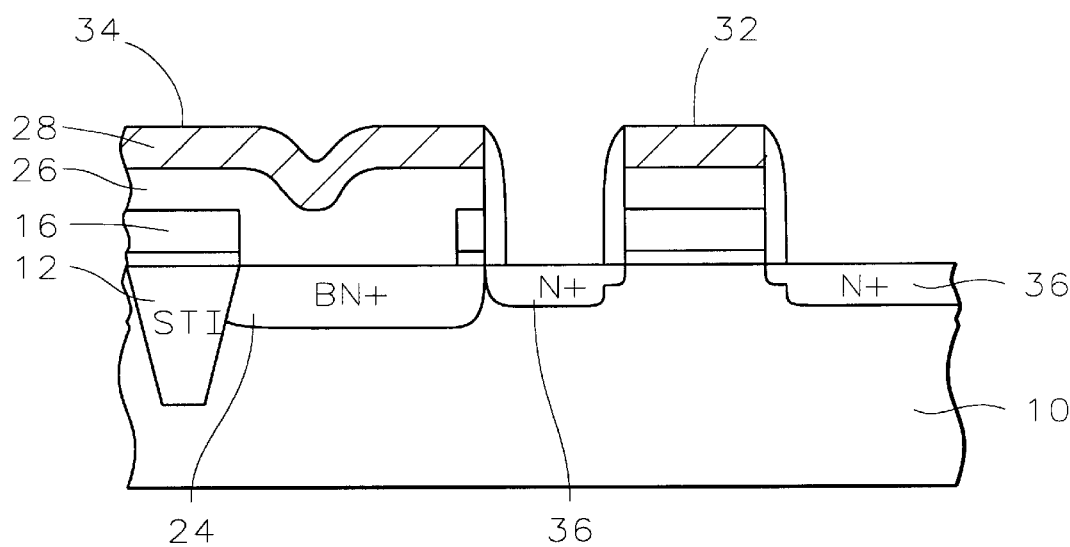
Figure 5:
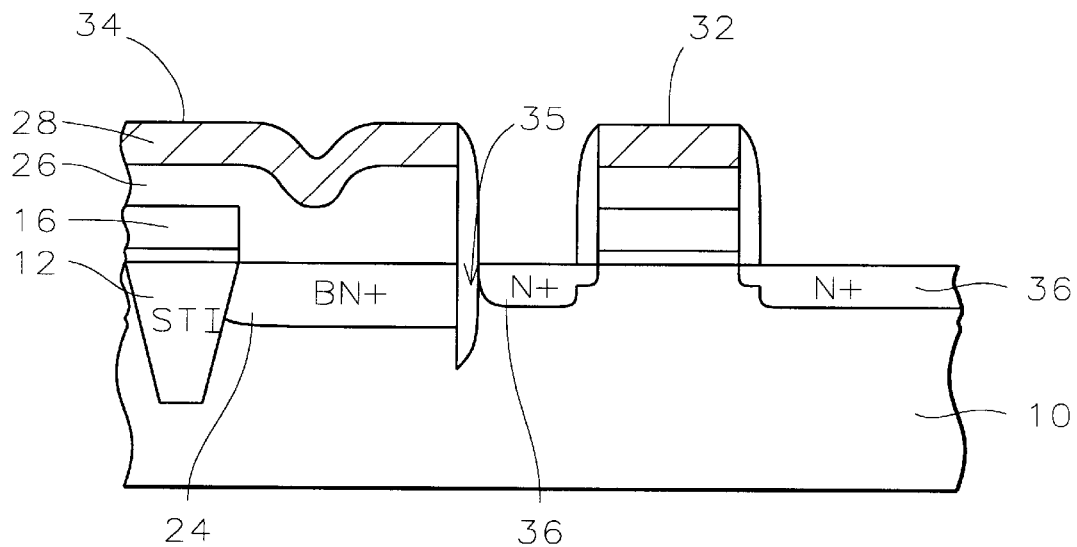
Figure 6:
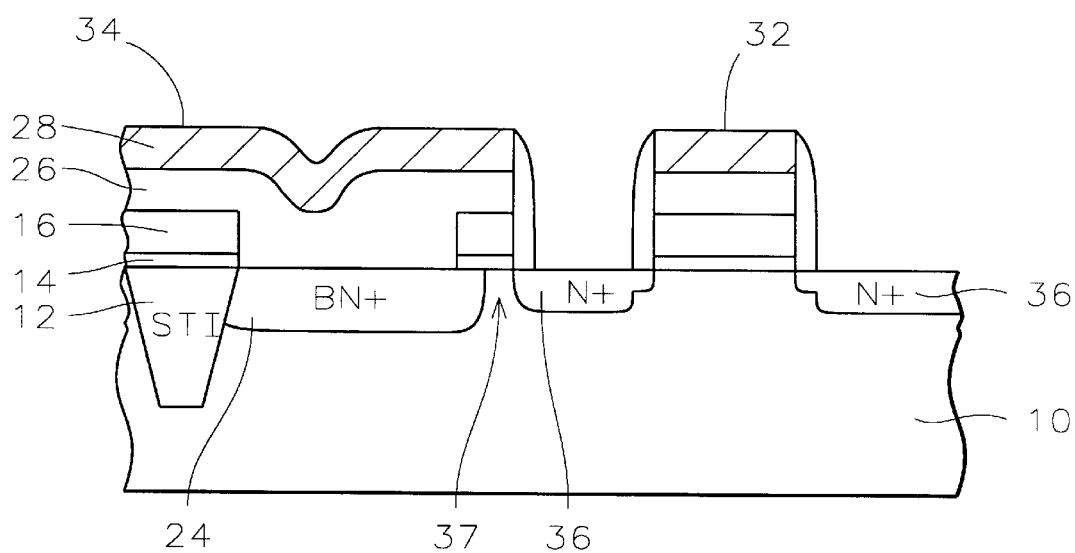
Figure 7:
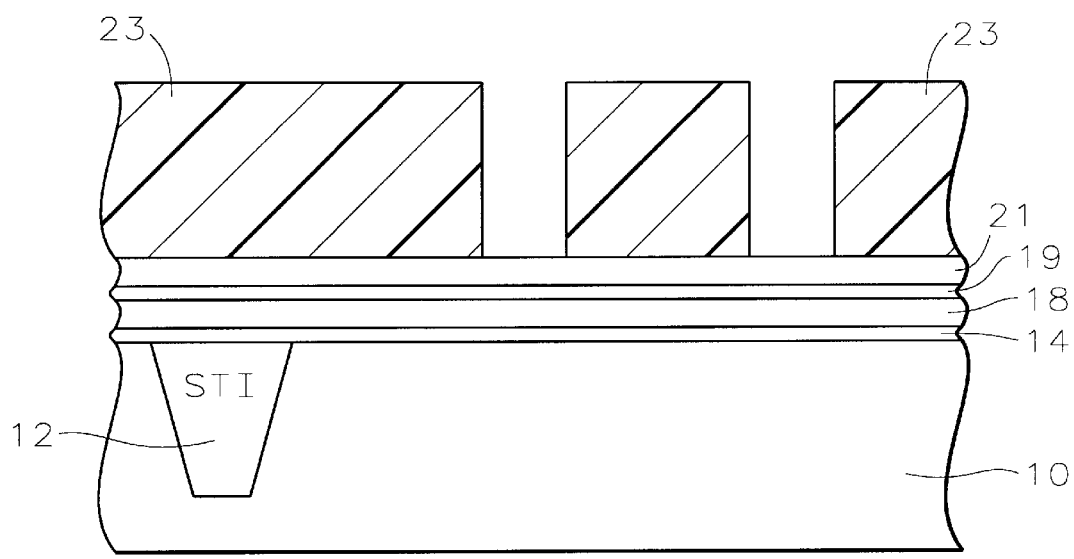
FIGS. 7 through 14 schematically illustrate in cross-sectional representation a preferred embodiment of the present invention.

Referring now more particularly to FIG. 7, there is shown a portion of a partially completed integrated circuit. There is shown a monocrystalline semiconductor substrate 10 in which there are formed shallow trench isolation regions 12. A layer of gate oxide 14 is grown over the surface of the substrate, typically to a thickness of between about 40 to 250 Angstroms.

Next, polysilicon layer 18 is deposited over the gate oxide layer 14. Usually, a split polysilicon layer is used. A thin polysilicon layer would be deposited at this time to protect the gate oxide while the opening for the buried contact region is etched. A thick layer of doped polysilicon would then be deposited within the buried contact opening and dopant would be driven in from the thick polysilicon layer to form the buried contact. However, in the process of the invention, a single polysilicon layer can be used without degrading the quality of the gate oxide. Thus, the process of the invention has a lower thermal budget. The single polysilicon layer 18 of the invention has a thickness of between about 1000 to 3000 Angstroms.

A thin layer of silicon oxide 19 is grown or deposited over the polysilicon layer 18 to a thickness of about 100 Angstroms.

Next, a layer of silicon nitride or other dielectric material 21 is deposited overlying the polysilicon layer 18 to a thickness of between about 1000 and 3000 Angstroms to be used as a hard mask. A layer of photoresist is coated over the silicon nitride layer and exposed, developed, and patterned to form the photoresist mask 23. This is the mask to form the gate electrode and interconnection lines.

Figure 8:
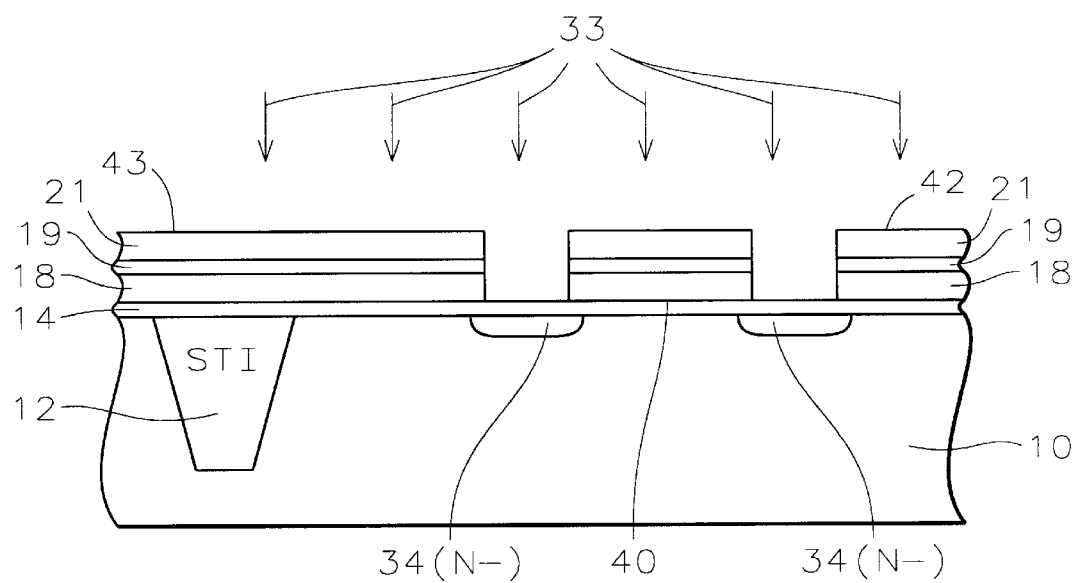

Referring now to FIG. 8, the silicon nitride, oxide, and polysilicon layers 21, 19, and 18 are etched away where they are not covered by the mask to form the polysilicon structures that will become gate electrode 40 and interconnection lines 42 and 43. Ions 33 are implanted to form lightly doped source/drain (LDD) regions 34. Alternatively, these LDD regions 34 can be formed later in the process.

Figure 9:
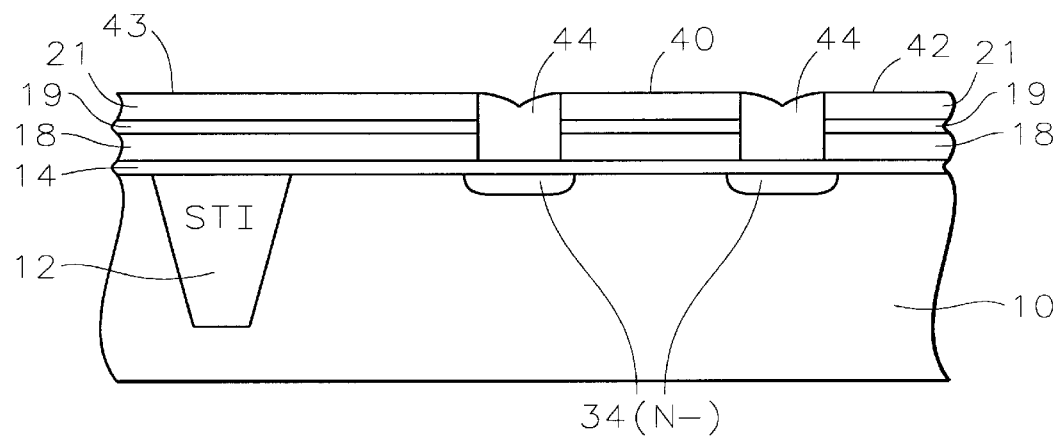

Now, the openings between the gate electrode and the interconnection lines are filled with an oxide material 44 deposited by chemical vapor deposition (CVD). The oxide may be sub-atmospheric CVD oxide, high density plasma CVD oxide, or the like. A spin-on-glass material may also be deposited to completely fill the openings and then etched back or planarized using chemical mechanical polishing (CMP) to result in filled openings and a planarized substrate, as illustrated in FIG. 9.

Figure 10:
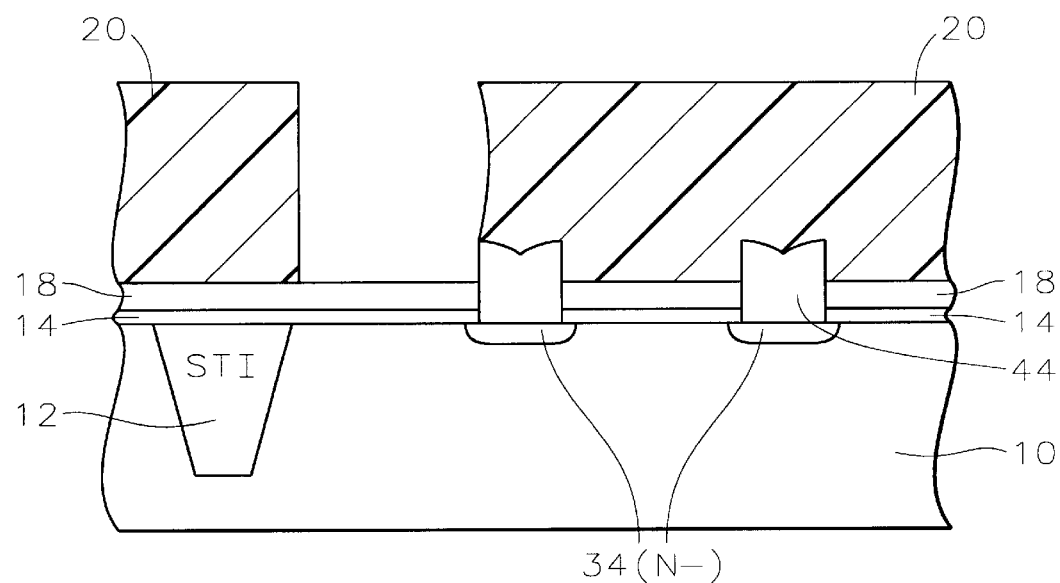
Figure 11:
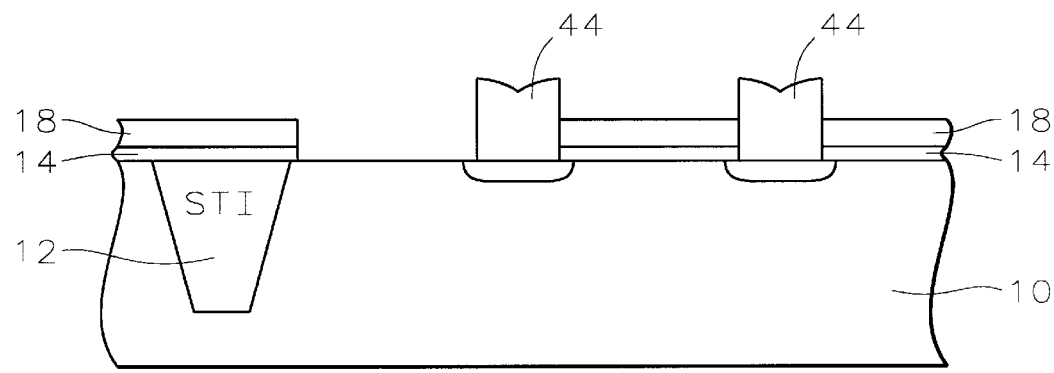

Referring now to FIG. 10, the silicon nitride layer 21 is etched away. The buried contact photoresist mask 20 is now formed over the wafer. The polysilicon 18 is etched away to open the buried contact, as illustrated in FIG. 11.

Figure 10A:
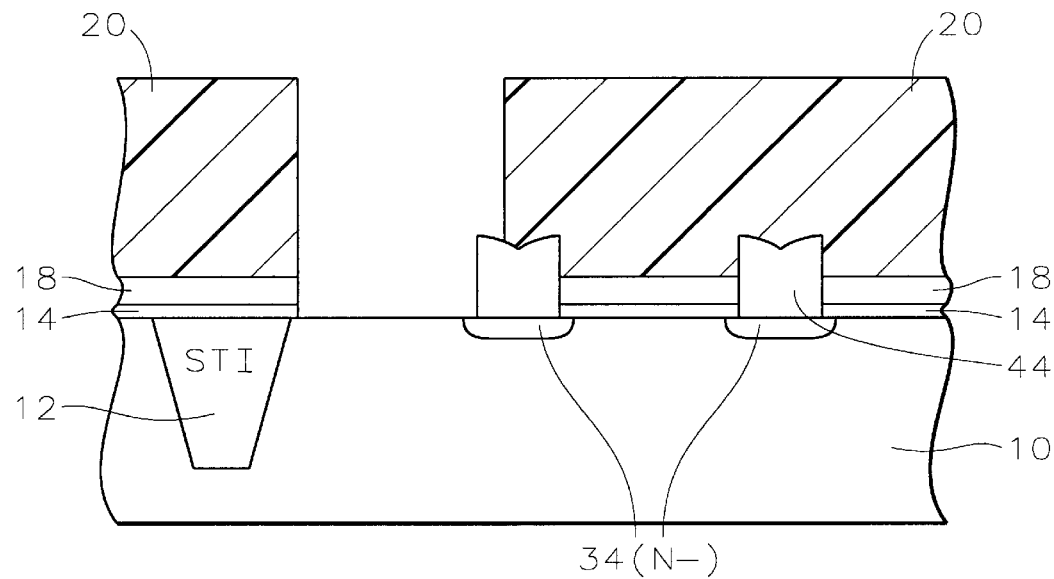
FIG. 10A schematically illustrates in cross-sectional representation an alternative mask used in a preferred embodiment of the present invention.

Since the buried contact opening is made after the gate electrode and interconnection line polysilicon patterning, there is no need to overlay the polysilicon mask. There will be no buried contact trench due to mask misalignment during polysilicon overetching. This allows the design rule of the polysilicon and buried contact masks to be tighter; hence device density can be increased. Since there will be no buried contact trench, the contact resistance and junction leakage can be decreased significantly. The problem of the disconnection gap can also be eliminated. As shown in FIG. 10A, the mask can be modified by shifting its edge to the right in order to prevent a disconnection gap caused by mask misalignment.

Figure 12:
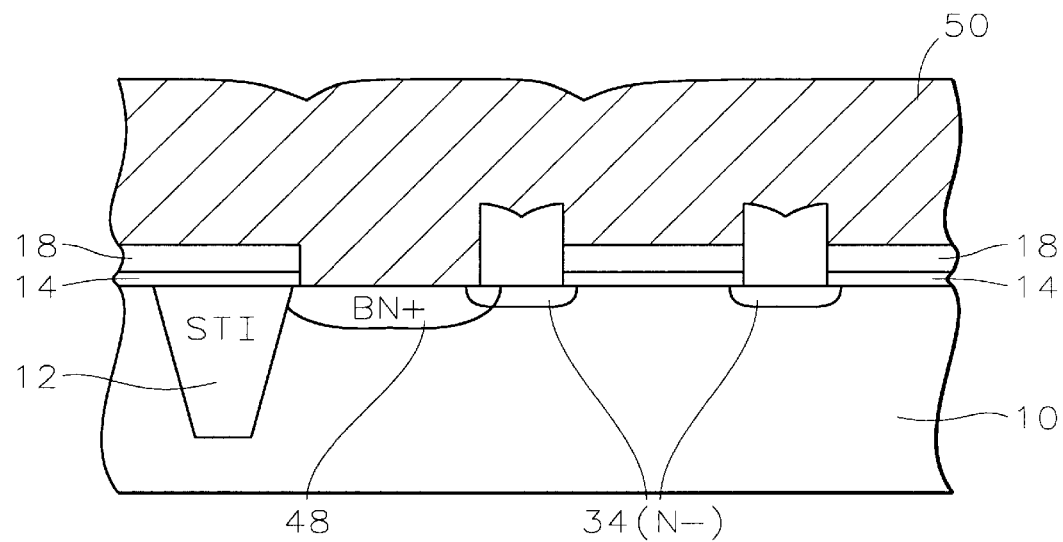

Referring now to FIG. 12, phosphorus ions are deposited into the buried contact opening at a dosage of between about 1 E 12 to 1 E 14 atoms/cm$^2$ at an energy of between about 30 to 60 KeV to form the buried contact 48.

Figure 13:
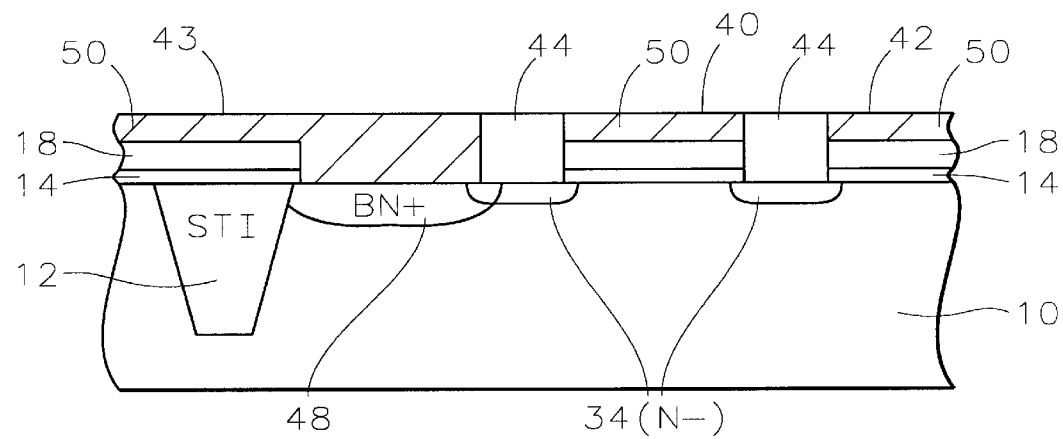

Next, a layer of refractory material, such as tungsten or tungsten silicide 50 is deposited overlying the polysilicon layer and within the buried contact opening. The tungsten or tungsten silicide layer 50 is planarized using, for example, chemical mechanical polishing (CMP) or etching back, as illustrated in FIG. 13. This process simultaneously forms the buried contact interconnection 43 and the tungsten polycide gate electrode 40.

Figure 14:
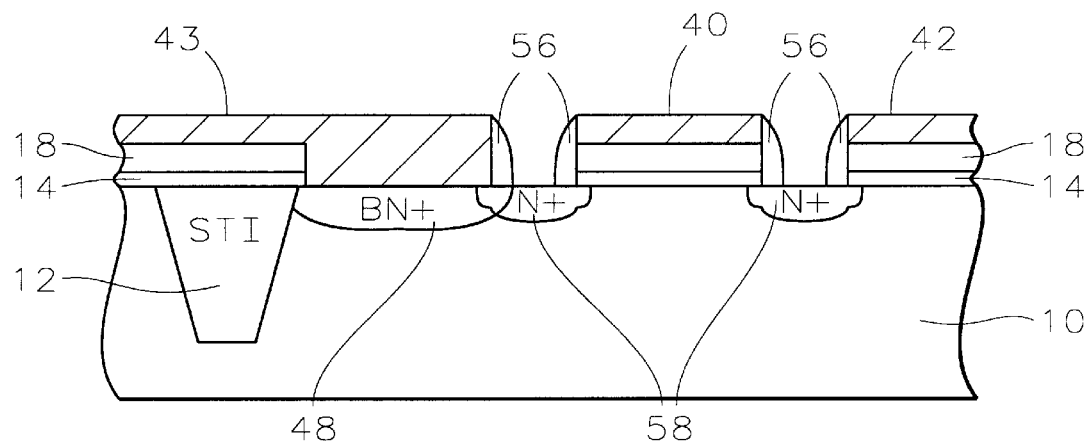

The oxide 44 between the gate electrode and interconnection lines is removed. The LDD regions 36 may alternatively be formed at this time. Then, a second oxide layer is deposited over the surface of the substrate and anisotropically etched to leave spacers 56 on the sidewalls of the gate electrode and interconnection lines, as shown in FIG. 14. Heavily doped source and drain regions 58 are implanted into the substrate using the gate electrode as a mask.

Figure 15:
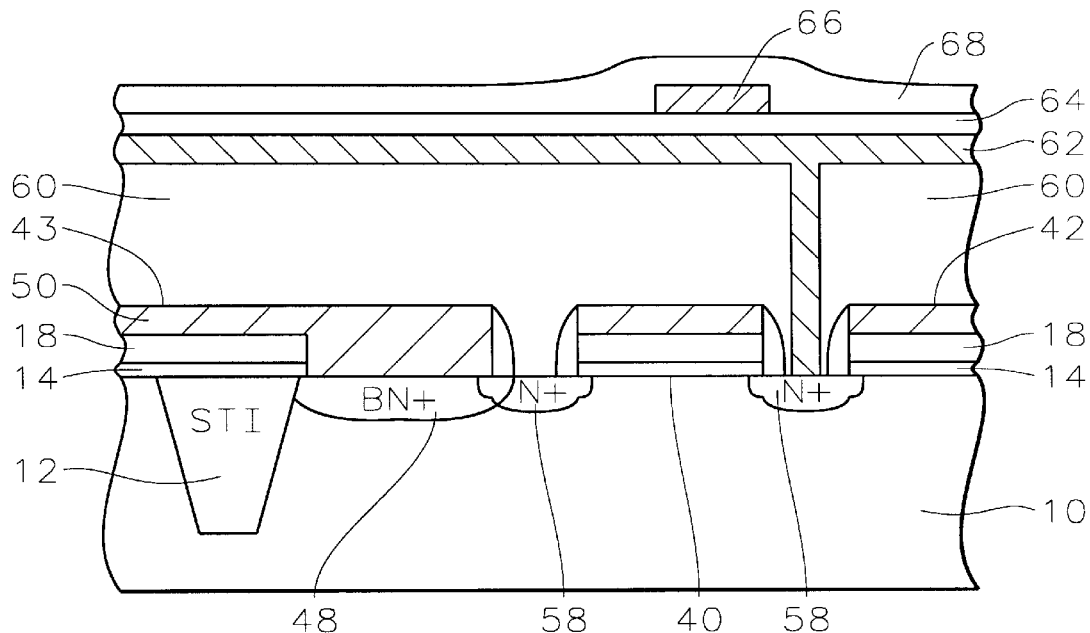
FIG. 15 schematically illustrates in cross-sectional representation a completed static random access memory (SRAM) fabricated according to the process of the present invention.

Processing continues as is conventional in the art to complete the integrated circuit device. FIG. 15 illustrates a cross-sectional view of a completed SRAM integrated circuit device with electrical connections. An insulating layer 60 is deposited overlying the gate electrode 40 and interconnection lines 42 and 43. The insulating layer may be composed of a thin layer of undoped oxide and a thick layer borophospho-TEOS (BP-TEOS) or borophosphosilicate (BPSG). An opening is etched through the insulating layer to one of the underlying source/drain regions 58. A metal layer 62 is deposited over the surface of the substrate and within the opening and patterned. An intermetal dielectric 64 is deposited, followed by the deposition and patterning of a second metal layer 66. A passivation layer 68 completes the SRAM integrated circuit device.

The integrated circuit device having a buried contact junction according to the present invention is described with reference to FIG. 15. FIG. 15 illustrates a cross-sectional view of a completed SRAM integrated circuit device with electrical connections. Buried contact junction 48 lies within the semiconductor substrate 10. A tungsten or tungsten silicide contact layer 50 overlies the buried contact junction. A polycide gate electrode 40 lies on the semiconductor substrate. Associated source and drain regions 58 lie on either side of the gate electrode within the semiconductor substrate. An insulating layer 60 covers the gate electrode 40 and interconnection lines 42 and 43. A metal layer 62 lies over the surface of the insulating layer 60 and extends through an opening within the insulating layer to one of the underlying source and drain regions 58. An intermetal dielectric layer 64 overlies the metal layer 62. A second patterned metal layer 66 overlies the intermetal dielectric layer. A passivation layer 68-completes the SRAM integrated circuit device.

The process of the invention avoids the etching of a trench into the buried contact junction because the buried contact opening is made after the gate electrode and polysilicon interconnection line patterning. The polysilicon gate electrode and interconnection lines are formed before the buried contact opening is etched so that it is not necessary to overlay the polysilicon and buried contact masks. This results in a trench-free buried contact process with significantly decreased contact resistance and junction leakage. Since the masks do not have to be overlaid, the design rules of the masks can be tighter, thereby increasing device density. Additionally, the buried contact mask could be modified by making the opening larger to prevent a disconnection gap. The process of the invention can be used in the fabrication of any integrated circuit device having a buried contact and polycide gate electrodes and interconnection lines, such as the static random access memory (SRAM) device illustrated in FIG. 15.

While the invention has been particularly shown and described with reference to the preferred embodiments thereof, it will be understood by those skilled in the art that various changes in form and details may be made without departing from the spirit and scope of the invention.

What is claimed is:

1. An integrated circuit device having a buried contact junction with local interconnect comprising:

a buried contact junction within a semiconductor substrate;

a planarized tungsten contact layer overlying said buried contact junction;

a polycide gate electrode on the surface of said semiconductor substrate;

silicon oxide spacers on the sidewalls of said tungsten contact layer and said polycide gate electrode;

source and drain regions within said semiconductor substrate surrounding said polycide gate electrode wherein one of said source and drain regions contacts said buried contact junction;

an insulating layer overlying said polycide gate electrode, said tungsten contact layer, and said source and drain regions; and a patterned conducting layer overlying said insulating layer and extending through an opening in said insulating layer to another one of said underlying source and drain regions.

2. The device according to claim 1 wherein said polycide gate electrode comprises a tungsten layer overlying a polysilicon layer.

3. The device according to claim 1 wherein said polycide gate electrode comprises a tungsten silicide layer overlying a polysilicon layer.

4. The device according to claim 2 wherein said polysilicon layer has a thickness of between about 1000 and 3000 Angstroms.

5. The device according to claim 3 wherein said polysilicon layer has a thickness of between about 1000 and 3000 Angstroms.

6. An integrated circuit device having a buried contact junction with local interconnect comprising:

a buried contact junction within a semiconductor substrate;

a planarized tungsten contact layer overlying said buried contact junction;

a polycide gate electrode on the surface of said semiconductor substrate wherein said polycide gate electrode comprises a planarized tungsten layer overlying a polysilicon layer;

silicon oxide spacers on the sidewalls of said tungsten contact layer and said polycide gate electrode;

source and drain regions within said semiconductor substrate surrounding said polycide gate electrode wherein one of said source and drain regions contacts said buried contact junction;

an insulating layer overlying said polycide gate electrode, said tungsten contact layer, and said source and drain regions; and a patterned conducting layer overlying said insulating layer and extending through an opening in said insulating layer to another one of said underlying source and drain regions.

7. The device according to claim 6 wherein said polysilicon layer has a thickness of between about 1000 and 3000 Angstroms.

8. The device according to claim 6 wherein said integrated circuit device is a static random access memory (SRAM) device.

9. A static random access memory (SRAM) integrated circuit device having a buried contact junction with local interconnect comprising:

a buried contact junction within a semiconductor substrate;

a planarized refractory material contact layer overlying said buried contact junction wherein said refractory material is selected from the group consisting of tungsten and tungsten silicide;

a polycide gate electrode on the surface of said semiconductor substrate wherein said polycide gate electrode comprises a planarized refractory material layer overlying a polysilicon layer and wherein said refractory material is selected from the group consisting of tungsten and tungsten silicide;

silicon oxide spacers on the sidewalls of said refractory material contact layer and said polycide gate electrode;

source and drain regions within said semiconductor substrate surrounding said polycide gate electrode wherein one of said source and drain regions contacts said buried contact junction;

an insulating layer overlying said polycide gate electrode, said refractory material contact layer, and said source and drain regions; and a patterned conducting layer overlying said insulating layer and extending through an opening in said insulating layer to another one of said underlying source and drain regions.

10. The device according to claim 9 wherein said polysilicon layer has a thickness of between about 1000 and 3000 Angstroms.

* * * * *